United States Patent
Jeong et al.

(10) Patent No.: US 9,698,205 B2
(45) Date of Patent: *Jul. 4, 2017

(54) ORGANIC LIGHT-EMITTING DIODE DISPLAY

(71) Applicant: Samsung Display Co., Ltd., Yongin-si, Gyeonggi-do (KR)

(72) Inventors: Minjae Jeong, Yongin-si (KR); Gyungsoon Park, Yongin-si (KR); Jongho Hong, Yongin-si (KR)

(73) Assignee: Samsung Dipslay Co., Ltd., Yongin, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/333,522

(22) Filed: Oct. 25, 2016

(65) Prior Publication Data
US 2017/0040395 A1    Feb. 9, 2017

Related U.S. Application Data

(63) Continuation of application No. 14/625,472, filed on Feb. 18, 2015, now Pat. No. 9,490,308.

(30) Foreign Application Priority Data

Oct. 21, 2014    (KR) .................... 10-2014-0142768

(51) Int. Cl.
*H01L 27/32* (2006.01)
*H01L 51/00* (2006.01)

(52) U.S. Cl.
CPC ...... *H01L 27/3248* (2013.01); *H01L 27/3276* (2013.01); *H01L 51/0097* (2013.01); *H01L 2251/5338* (2013.01)

(58) Field of Classification Search
CPC ............. H01L 51/0545; H01L 51/0036; H01L 51/0541; H01L 51/5012
See application file for complete search history.

(56) References Cited

U.S. PATENT DOCUMENTS

| | | | |
|---|---|---|---|
| 7,242,398 B2 | 7/2007 | Nathan et al. | |
| 9,490,308 B2* | 11/2016 | Jeong | .................. H01L 27/3248 |
| 2011/0316803 A1 | 12/2011 | Kim | |
| 2013/0041235 A1 | 2/2013 | Rogers et al. | |
| 2014/0138635 A1 | 5/2014 | Lee et al. | |

FOREIGN PATENT DOCUMENTS

| KR | 10-0222896 B1 | 7/1999 |
|---|---|---|
| KR | 10-2001-0103431 A | 11/2001 |
| KR | 10-2012-0001406 A | 1/2012 |
| KR | 10-2014-0063306 A | 5/2014 |

* cited by examiner

*Primary Examiner* — Quoc Hoang
(74) *Attorney, Agent, or Firm* — Knobbe, Martens, Olson & Bear, LLP (57) ABSTRACT

An organic light-emitting diode (OLED) display is disclosed. In one aspect, the display includes a stretchable substrate, a thin film transistor (TFT) formed over the stretchable substrate and including a plurality of electrodes, an OLED electrically connected to the TFT and including a plurality of electrodes, and a plurality of interconnection lines connected to the electrodes of the OLED and the TFT. At least one of the interconnection lines is configured to move in a stretching direction and rotate an electrode selected from the electrodes of the OLED and the TFT connected to the at least one interconnection line.

15 Claims, 7 Drawing Sheets

ORGANIC LIGHT-EMITTING DIODE DISPLAY

RELATED APPLICATION

This application is a continuation of U.S. patent application Ser. No. 14/625,472, filed Feb. 18, 2015, which claims priority under 35 U.S.C. §119 to Korean Patent Application No. 10-2014-0142768, filed on Oct. 21, 2014, in the Korean Intellectual Property Office, the disclosures of which are incorporated by reference herein in their entireties.

BACKGROUND

Field

The described technology generally relates to a stretchable organic light-emitting diode display.

Description of the Related Technology

In general, an organic light-emitting diode (OLED) display includes a thin film transistor (TFT) and an OLED. It also has a structure in which the OLED receives a driving signal from the TFT and emits light to produce a desired image.

The TFT has a structure in which an active region, a gate electrode, a source electrode, and a drain electrode are stacked on a substrate. Accordingly, when current is supplied to the gate electrode through an interconnection line formed on the substrate, current flows through the source electrode and the drain electrode via the active layer, and at the same time, current flows through a pixel electrode of the OLED, which is connected to the drain electrode.

The OLED includes the pixel electrode, an opposite electrode that is opposite to the pixel electrode, and an emission layer interposed between the pixel electrode and the opposite electrode. In such a structure, when current flows through the pixel electrode via the TFT as described above, an appropriate voltage is formed between the opposite electrode and the pixel electrode, and thus, an image is produced while light is emitted from the emission layer.

Recently, there have been increased attempts to form an OLED display having a flexible structure that is stretchable.

SUMMARY OF CERTAIN INVENTIVE ASPECTS

One inventive aspect is a stretchable OLED display.

Another aspect is an OLED display that includes: a stretchable substrate; a thin film transistor formed on the stretchable substrate; an OLED connected to the thin film transistor; and interconnection lines connected to electrodes of the OLED and thin film transistors, wherein at least one of the interconnection lines moves in an stretching direction and rotates an electrode connected to the at least one interconnection line.

The at least one interconnection line can be connected to a corner portion of the electrode.

The least one interconnection line connected to the corner portion of the electrode can include a bent portion that can be straightened when the stretchable substrate is stretched.

The thin film transistor can include an active layer, a gate electrode, a source electrode, and a drain electrode, and the OLED can include a pixel electrode, an emission layer, and an opposite electrode.

The electrode having the corner portion connected to the least one interconnection line can be any one selected from the pixel electrode, the gate electrode, the source electrode, the drain electrode, and the opposite electrode.

The electrode can have four corners, and interconnection lines can be respectively connected to the four corners.

Another aspect is an organic light-emitting diode (OLED) display comprising a stretchable substrate, a thin film transistor (TFT) formed over the stretchable substrate and including a plurality of electrodes, an OLED electrically connected to the TFT and including a plurality of electrodes, and a plurality of interconnection lines connected to the electrodes of the OLED and the TFT. At least one of the interconnection lines is configured to move in a stretching direction and rotate an electrode selected from the electrodes of the OLED and the TFT connected to the at least one interconnection line.

In the above OLED display, the at least one interconnection line is connected to a corner portion of the selected electrode.

In the above OLED display, the least one interconnection line comprises a bent portion configured to be straightened when the stretchable substrate is stretched.

In the above OLED display, the TFT comprises an active layer, a gate electrode, a source electrode, and a drain electrode, wherein the OLED comprises a pixel electrode, an emission layer, and an opposite electrode.

In the above OLED display, the selected electrode includes at least one of the pixel electrode, the gate electrode, the source electrode, the drain electrode, and the opposite electrode.

In the above OLED display, the selected electrode has four corners, wherein the interconnection lines are respectively connected to the four corners.

Another aspect is an organic light-emitting diode (OLED) display comprising an elastic substrate, an OLED formed over the substrate and including a plurality of electrodes, and a plurality of first interconnection lines each having a plurality of bent portions and a plurality of substantially straight portions connected to the bent portions. One of the bent portions is connected to a first electrode selected from the OLED electrodes, wherein one end of the interconnection lines is configured to be pulled away from the first selected electrode so as to rotate the first selected electrode.

In the above OLED display, the substantially straight portions are substantially parallel to each other.

The above OLED display further comprises a thin film transistor (TFT) formed over the OLED and including a plurality of electrodes. The above OLED display further comprises a plurality of second interconnection lines each having a plurality of bent portions and a plurality of substantially straight portions connected to the bent portions, wherein one of the bent portions is connected to a second electrode selected from the TFT electrodes, and wherein one end of the second interconnection lines is configured to be pulled away from the second selected electrode so as to rotate the second selected electrode.

In the above OLED display, the substantially straight portions are substantially parallel to each other, In the above OLED display, each of the first and second interconnection lines is respectively connected to corner portions of the first and second electrodes.

In the above OLED display, the bent portions are configured to be straightened when the substrate is stretched.

In the above OLED display, the first selected electrode includes one of a pixel electrode and an opposite electrode.

In the above OLED display, the second selected electrode includes one of a gate electrode, a source electrode, and a drain electrode.

In the above OLED display, each of the first and second selected electrodes has four corner portions, wherein the interconnection lines are respectively connected to the four corners.

In the above OLED display, the first interconnection lines have a substantially zigzag shape.

DETAILED DESCRIPTION OF CERTAIN INVENTIVE EMBODIMENTS

Reference will now be made in detail to embodiments, examples of which are illustrated in the accompanying drawings. In this regard, the present embodiments can have different forms and should not be construed as being limited to the descriptions set forth herein. Accordingly, the embodiments are merely described below, by referring to the figures, to explain aspects of the present description.

In the accompanying drawings, those components that are the same or are in correspondence are rendered the same reference numeral regardless of the figure number, and redundant explanations are omitted.

Throughout the specification, a singular form can include plural forms, unless there is a particular description contrary thereto.

Throughout the specification, it will be further understood that the terms "comprises" and/or "comprising" used herein specify the presence of stated features or components, but do not preclude the presence or addition of one or more other features or components.

Throughout the specification, it will be understood that when a layer, region, or component is referred to as being "formed on," another layer, region, or component, it can be directly or indirectly formed on the other layer, region, or component. That is, for example, intervening layers, regions, or components can be present.

In the drawings, for convenience of description, the thicknesses or sizes of elements are exaggerated for clarity, but one or more embodiments of the present invention are not limited thereto.

Also, it should also be noted that in some alternative implementations, the steps of all methods described herein can occur out of the order. For example, two steps illustrated in succession can in fact be executed substantially concurrently or the two steps can sometimes be executed in the reverse order. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 1:
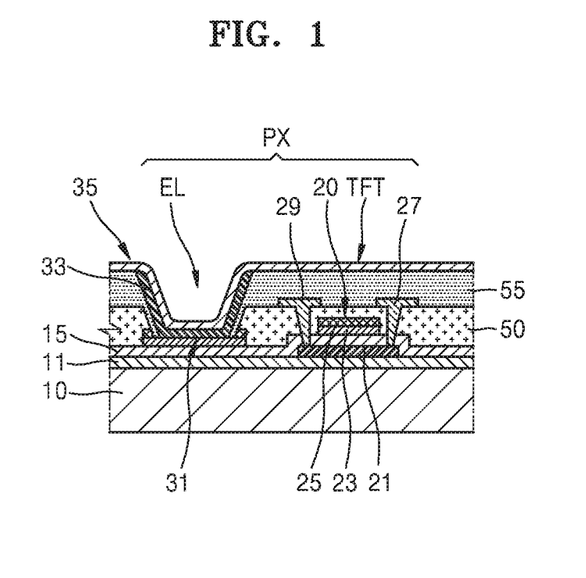
FIG. 1 is a cross-sectional view illustrating a structure of an OLED display according to an embodiment.

FIG. 1 is a schematic cross-sectional view illustrating a portion of a stretchable OLED display according to an embodiment.

As illustrated in FIG. 1, the stretchable OLED display has a structure in which a TFT and an OLED EL are formed on a buffer layer 11 of a substrate 10. The substrate 10 is formed of a stretchable ductile material or elastic material.

The TFT includes an active layer 21, a gate electrode 20, a source electrode 27, and a drain electrode 29. The gate electrode 20 includes a lower gate electrode 23 and an upper gate electrode 25. The lower gate electrode 23 is formed of a transparent conductive material. The upper gate electrode 25 is formed of a metal material. A gate insulating layer 15 is interposed between the gate electrode 20 and the active layer 21 to insulate the gate electrode 20 from the active layer 21. In addition, source and drain regions, in which high concentration impurities are implanted, are formed at both edges of the active layer 21 The source electrode 27 and the drain electrode 29 are respectively connected to the source region and the drain region.

The active layer 21 can be formed of an oxide semiconductor. For example, the oxide semiconductor is formed of an oxide of a Group 12, 13, or 14 metal element, such as zinc (Zn), indium (In), gallium (Ga), tin (Sn), cadmium (Cd), germanium (Ge), or hafnium (Hf), and a material selected from combinations thereof. For example, the active layer 21 includes G-I-Z-O[$(In_2O_3)a(Ga_2O_3)b(ZnO)c$] (where a, b, and c are real numbers that respectively satisfy conditions of a≥0, b≥0, and c>0).

The OLED EL includes a pixel electrode 31 connected to the drain electrode 29 of the TFT, an opposite electrode 35 functioning as a cathode, and an emission layer 33 interposed between the pixel electrode 31 and the opposite electrode 35. Reference numeral 50 denotes an interlayer insulating layer, and reference numeral 55 denotes a pixel-defining layer defining a pixel region.

A hole injection layer (HIL), a hole transport layer (HTL), an electron transport layer (ETL), and an electron injection layer (EIL) can be stacked adjacent to the emission layer 33.

The emission layer 33 can be separately formed for each pixel so that pixels emitting red light, green light, and blue light can be included in one unit pixel. The emission layer 33 can also be formed in common throughout the entire pixel region regardless of the positions of the pixels. Here, the emission layer 33 can have a structure in which layers formed of emission materials for emitting red light, green light, and blue light are stacked or the emission materials are combined. A combination of other colors can also be possible, provided that the combination of other colors can emit white light. Also, the emission layer 33 can further include a color conversion layer or a color filter that converts the emitted white light into a predetermined color.

The substrate 10 can be formed of a flexible material that is stretchable, as described above. For example, the substrate 10 is formed of a material such as polydimethylsiloxane (PDMS). Accordingly, the substrate 10 is stretchable when pulling the substrate 10 in a plane direction.

However, in some embodiments, when interconnection lines formed in the OLED EL or the TFT are cut when pulling the substrate 10 to stretch the substrate 10, a display operation is not normally performed. Accordingly, in the current embodiment, a structure, as shown in FIG. 2, is provided as an interconnection structure for preventing such a problem.

The OLED display includes a great number of electrodes, such as the pixel electrode 31, the opposite electrode 35, the gate electrode 20, the source electrode 27, and the drain electrode 29. The OLED display also includes many interconnection lines formed in the OLED display to electrically connect the electrodes to each other. In FIG. 2, an interconnection structure of the pixel electrode 31 is illustrated as an example.

Figure 2:
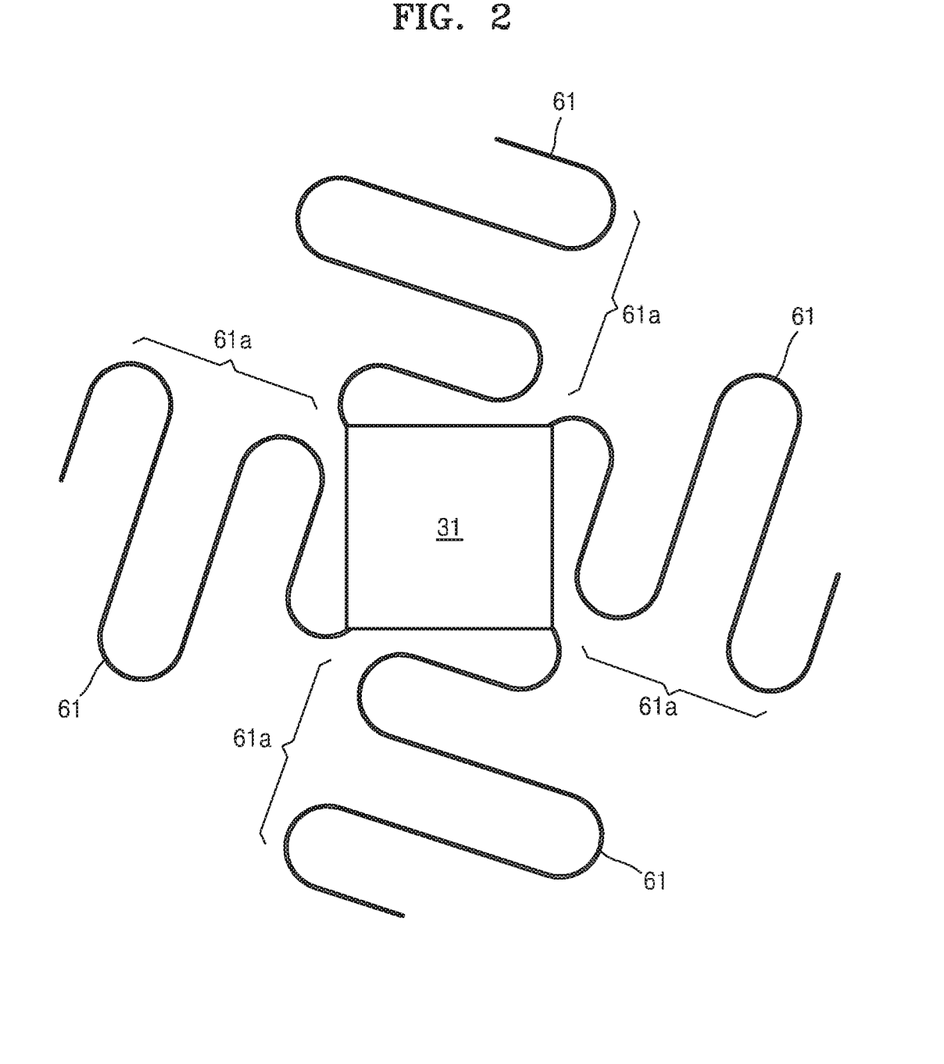
FIG. 2 is a diagram illustrating an interconnection structure of a pixel electrode in the OLED display of FIG. 1.

FIG. 2 is a plan view of the pixel electrode 31 and interconnection lines 61 connected to the pixel electrode 31 illustrated in FIG. 1. The interconnection lines 61 connect the pixel electrode 31 to the drain electrode 29.

Each of the interconnection lines 61 is not formed as a straight line but a shape having a tortuously curved bent portion 61a. The bent portion 61a is straightened into a substantially straight line (refer to FIG. 3) when stretching the substrate 10 such that the interconnection lines are pulled away from the pixel electrode 31, and thus, the cutting of the interconnection lines 61 is suppressed. For example, if each of the interconnection lines 61 is a substantially straight line in a contraction state of the substrate 10 when there is no slack in the interconnection lines 61, cracks or cutting of the interconnection lines 61 occurs in the interconnection lines 61 when stretching the substrate 10. However, when the bent portion 61a is included in each of the interconnection lines 61, like in the current embodiment, it is possible to prevent cracks or cutting of the interconnection lines 61, when stretching the substrate 10, since the interconnection lines 61 have a sufficient length margin.

Figure 3:
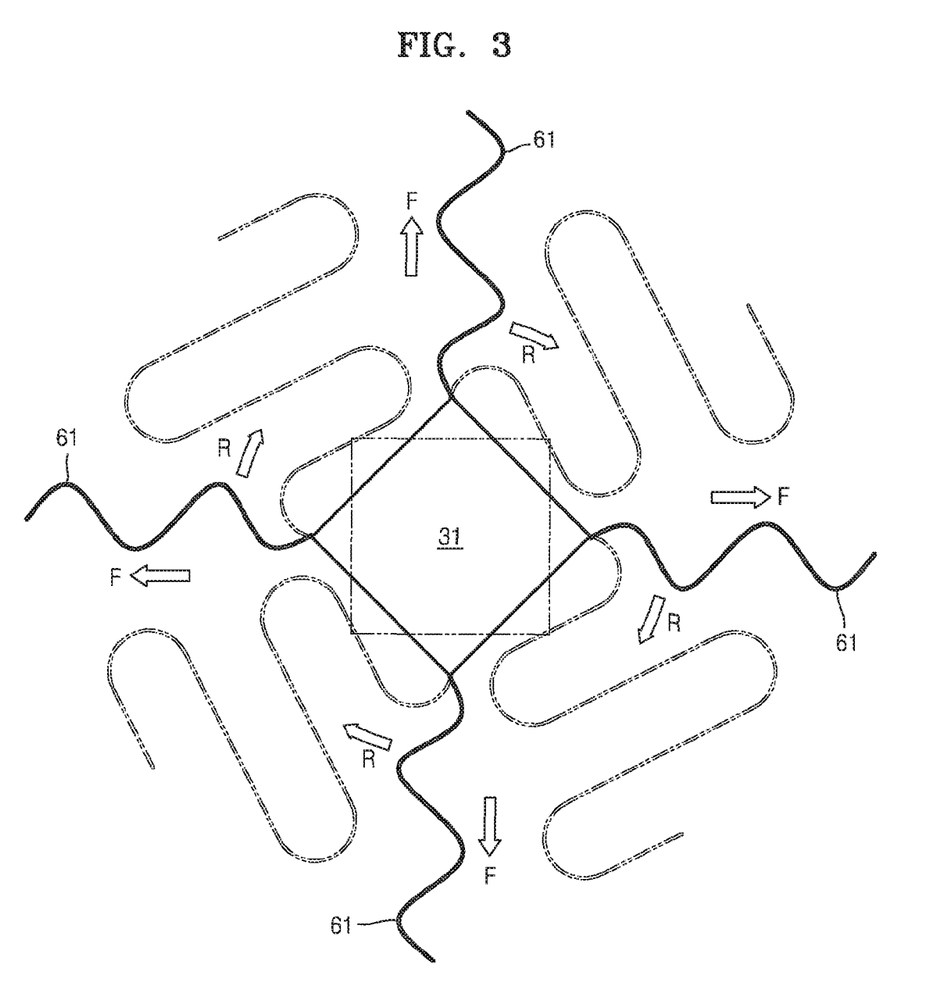
FIG. 3 is a diagram illustrating a form in which the interconnection structure of FIG. 2 is modified during the stretching of the OLED display of FIG. 1.

Furthermore, the interconnection lines 61 are respectively connected to four corner portions of the pixel electrode 31 to increase the amount of stretching of the substrate 10 while suppressing risk of damaging the interconnection lines 61. For example, when the interconnection lines 61 are connected to the four corner portions of the pixel electrode 31, the pixel electrode 31 is slightly rotated as illustrated in FIG. 3 while the interconnection lines 61 are substantially straightened when stretching the substrate 10. When the stretching of the substrate 10 is performed in the direction of the arrow F, the interconnection lines 61 move while being straightened into straighter lines along a stretching direction. Accordingly, a turning force acts on the pixel electrode 31 connected to the interconnection lines 61 and the corner portions, and thus, the pixel electrode 31 is slightly rotated in the direction of the arrow R. As a result, the interconnection lines 61 can have a margin to move farther in the stretching direction (the direction of the arrow F) by as much as the pixel electrode 31 is rotated, and thus, the amount of stretching of the substrate 10 can be increased while damage to the interconnection lines 61 is suppressed.

An operation of stretching the OLED display is as follows. When the substrate 10 is pulled and stretched in the direction of the arrow F which is a plane direction, as shown in FIG. 3, the interconnection lines 61 each having the bent portion 61a are straightened into straighter lines and, at the same time, the pixel electrode 31 is rotated in the direction of the arrow R.

Accordingly, the interconnection lines 61 can be stretched by a sufficient amount without receiving stress due to the modification of the bent portion 61a and the rotation of the pixel electrode 31. Therefore, an OLED display that is able to be stretched a large amount can be implemented.

Although the interconnection lines 61 connected to the pixel electrode 31 are described as an example in the current embodiment, the same interconnection structure can be applied to other electrodes, as illustrated in FIGS. 4A through 4D.

Figure 4A:
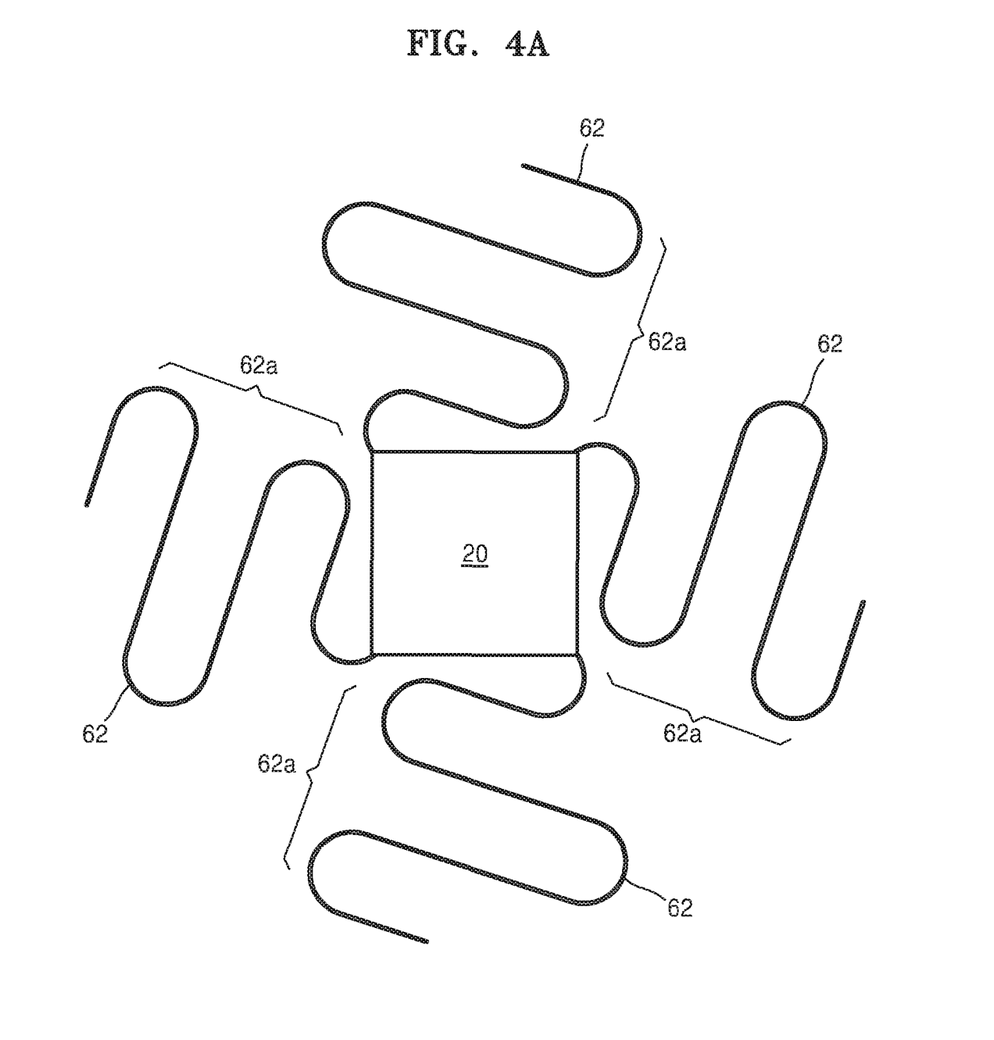
FIG. 4A through 4D are diagrams illustrating cases in which the interconnection structure of FIG. 2 is applied to other electrodes.
Figure 4B:
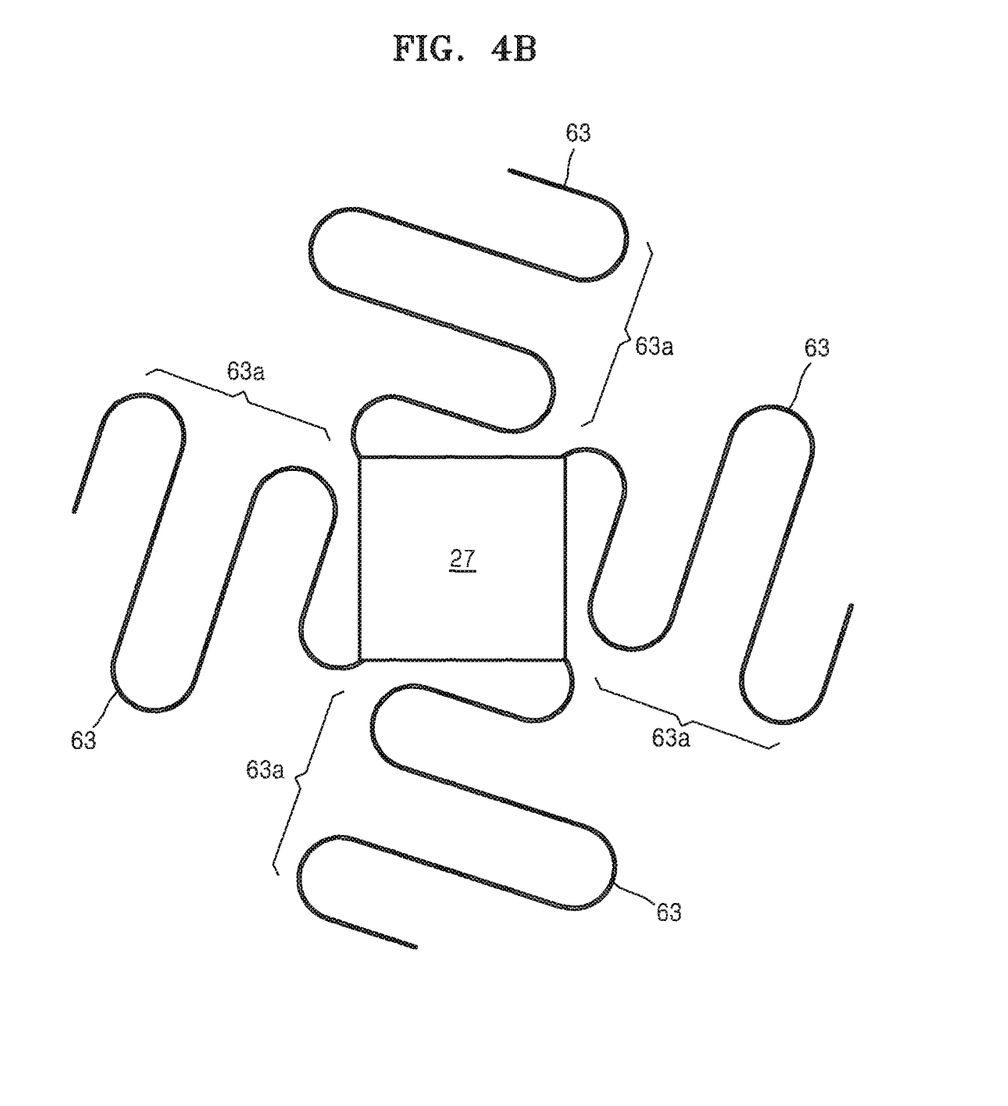
Figure 4C:
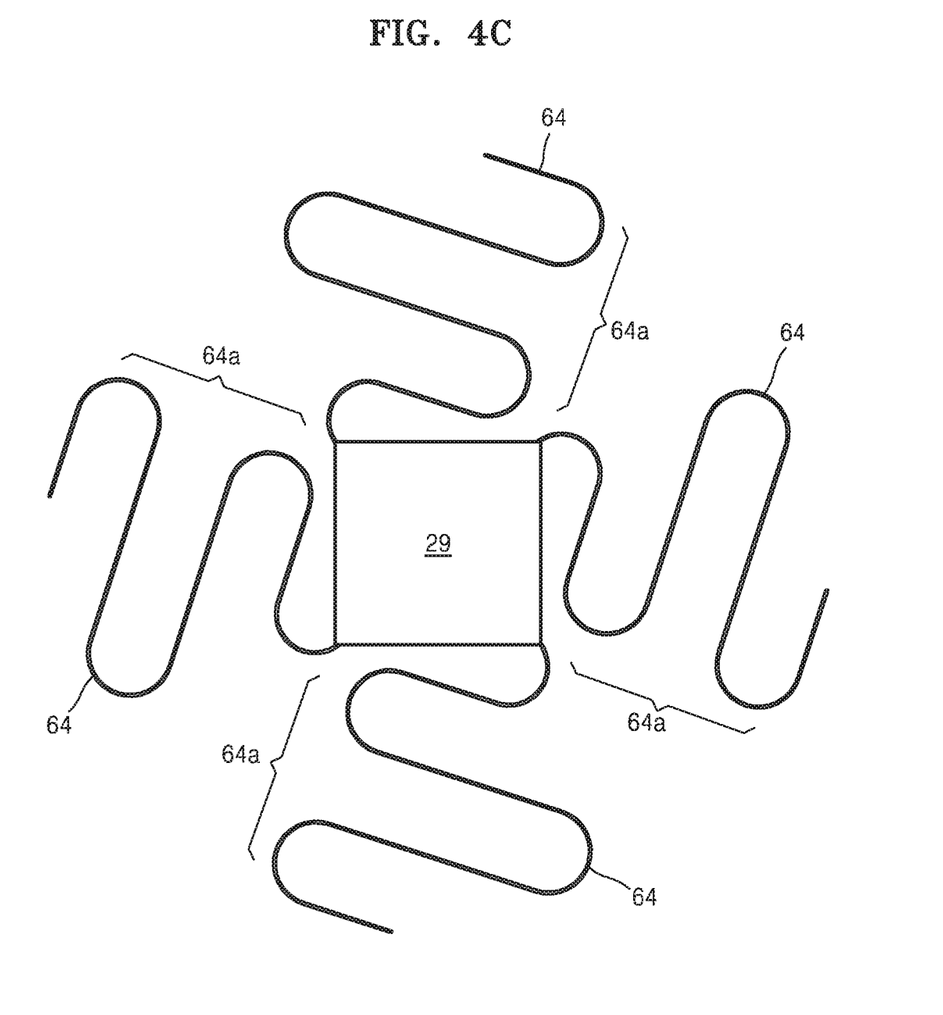
Figure 4D:
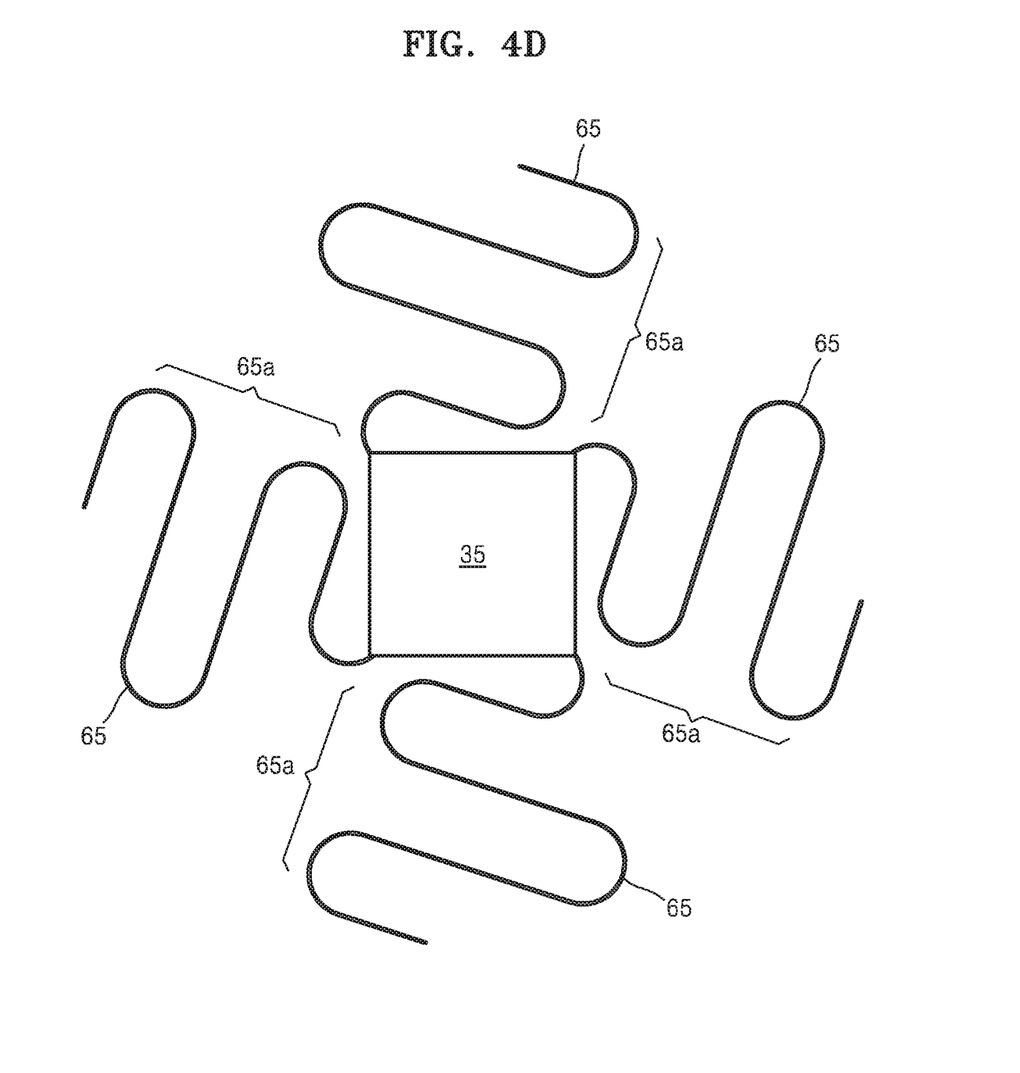

As illustrated in FIG. 4A, interconnection lines 62 each having a bent portion 62a are connected to corners of a gate electrode 20. As illustrated in FIG. 4B, interconnection lines 63 each having a bent portion 63a are connected to corners of a source electrode 27. As illustrated in FIG. 4C, interconnection lines 64 each having a bent portion 64a are connected to corners of a drain electrode 29. As illustrated in FIG. 4D, interconnection lines 65 each having a bent portion 65a are connected to corners of an opposite electrode 35. Accordingly, when the substrate 10 is stretched, the bent portions 62a, 63a, 64a, and 65a can be straightened and the gate, source, drain, and opposite electrodes 20, 27, 29, and 35 can be rotated. Thus, a safe and sufficient amount of stretching can be obtained, similar to the case described above.

In addition, although the gate, source, drain, and opposite electrodes 20, 27, 29, and 35 of FIGS. 4A through 4D have tetragonal shapes and interconnection lines are connected to corner portions of the electrodes 20, 27, 29, and 35, the described technology is not limited thereto. For example, if turning forces act on the electrodes 20, 27, 29, and 35 according to a movement of the interconnection lines in a stretching direction, the same effect can be obtained even if the electrodes 20, 27, 29, and 35 have other shapes. For example, each of the electrodes 20, 27, 29, and 35 has a different polygonal shape having a different number of vertices than that of a tetragon.

In addition, as well as vertices, the corner portions can be portions adjacent to the vertices, which allow the electrodes 20, 27, 29, and 35, to be rotated when pulling the interconnection lines.

As described above, in the OLED display according to the one or more of the above exemplary embodiments, interconnection lines are straightened during the stretching of the OLED display and an electrode connected to the interconnection lines is rotated, and thus, the amount of stretching can be considerably increased. Accordingly, when the OLED display according to the one or more of the above exemplary embodiments is used, a product having a very excellent stretching capability can be implemented.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details can be made therein without departing from the spirit and scope as defined by the following claims.

What is claimed is:

1. An organic light-emitting diode (OLED) display comprising:
   a stretchable substrate;
   a thin film transistor (TFT) over the stretchable substrate and comprising a plurality of electrodes;
   an OLED electrically connected to the TFT and including a plurality of electrodes; and
   a plurality of interconnection lines connected to a corner portion of one selected from among the plurality of electrodes of the OLED and the plurality of electrodes of the TFT,
   wherein the selected electrode has at least four corners, and the interconnection lines are respectively connected to the four corners, and
   wherein the interconnection lines and the selected electrode are movable in a stretching direction.

2. The OLED display of claim 1, wherein a selected electrode is rotatable.

3. The OLED display of claim 1, wherein the selected electrode has a square shape.

4. The OLED display of claim 3, wherein the interconnection lines connected to opposite corners of the selected electrode are stretchable opposite to each other.

5. The OLED display of claim 4, wherein the interconnection lines connected to the four corners are arranged at a regular interval of 90 degrees.

6. The OLED display of claim 3, wherein the interconnection lines are respectively connected to four corners of the selected electrode of the square shape and extended to outside the selected electrode from the four corners, and directions in which the interconnection lines extend are not in parallel with a center line between two facing sides of the selected electrode of the square shape.

7. The OLED display of claim 6, wherein the interconnection lines connected to the four corners each extends from one of two facing sides of the electrode of the square shape toward the other of the two facing sides while forming an entirely whirlwind shape.

8. The OLED display of claim 7, wherein the whirlwind shape is made in a clockwise direction or in a counter-clockwise direction.

9. The OLED display of claim 1, wherein the interconnection lines comprise a bent portion configured to be straightened when the stretchable substrate is stretched.

10. The OLED display of claim 1, wherein the TFT comprises an active layer, a gate electrode, a source electrode, and a drain electrode, and wherein the OLED comprises a pixel electrode, an emission layer, and an opposite electrode.

11. The OLED display of claim 10, wherein the selected electrode includes the pixel electrode.

12. The OLED display of claim 10, wherein the selected electrode includes the gate electrode.

13. The OLED display of claim 10, wherein the selected electrode includes the source electrode.

14. The OLED display of claim 10, wherein the selected electrode includes the drain electrode.

15. The OLED display of claim 10, wherein the selected electrode includes the opposite electrode.

* * * * *